(12) United States Patent
Chen et al.

(10) Patent No.: US 7,595,249 B2
(45) Date of Patent: Sep. 29, 2009

(54) BIPOLAR TRANSISTORS WITH VERTICAL STRUCTURES

(75) Inventors: Young-Kai Chen, Berkeley Heights, NJ (US); Lay-Lay Chua, Cambridge (GB); Vincent Etienne Houtsma, Berkeley Heights, NJ (US); Rose Fasano Kopf, Green Brook, NJ (US); Andreas Leven, Gillette, NJ (US); Chun-Ting Liu, Hsin-chu (TW); Wei-Jer Sung, New Providence, NJ (US); Yang Yang, Gillette, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/286,239

(22) Filed: Sep. 29, 2008

(65) Prior Publication Data

US 2009/0029536 A1 Jan. 29, 2009

Related U.S. Application Data

(60) Division of application No. 11/079,166, filed on Mar. 14, 2005, now abandoned, which is a division of application No. 10/243,369, filed on Sep. 13, 2002, now Pat. No. 6,911,716, which is a continuation-in-part of application No. 10/237,917, filed on Sep. 9, 2002, now abandoned.

(51) Int. Cl.
*H01L 21/331* (2006.01)
*H01L 21/8222* (2006.01)

(52) U.S. Cl. ...... 438/309; 438/336; 438/338; 257/E21.35

(58) Field of Classification Search ......... 438/309, 438/312–313, 315, 336, 338; 257/E21.35, 257/E21.372
See application file for complete search history.

(56) References Cited

U.S. PATENT DOCUMENTS

| 4,698,127 A | 10/1987 | Hideshima et al. ......... 438/353 |
| 5,096,844 A | 3/1992 | Konig et al. ............... 438/348 |
| 5,298,438 A | 3/1994 | Hill .......................... 437/31 |
| 5,459,084 A | 10/1995 | Ryum et al. ................ 437/31 |
| 5,696,007 A | 12/1997 | Ryum et al. ............... 437/132 |
| 5,710,452 A | 1/1998 | Narita ....................... 257/355 |
| 5,798,277 A | 8/1998 | Ryum et al. ................ 437/31 |
| 5,834,800 A | 11/1998 | Jalali-Farahani et al. .... 257/198 |
| 6,190,984 B1 | 2/2001 | Ryum et al. ............... 438/309 |
| 6,198,139 B1 | 3/2001 | Ishido ....................... 257/372 |
| 6,249,030 B1 | 6/2001 | Lee .......................... 257/368 |

(Continued)

OTHER PUBLICATIONS

U.S. Appl. No. 10/624,038, filed Jul. 21, 2003, Y.K. Chen et al.

*Primary Examiner*—Thanhha Pham
(74) *Attorney, Agent, or Firm*—John F. McCabe

(57) ABSTRACT

A method for fabricating a bipolar transistor includes forming a vertical sequence of semiconductor layers, forming an implant mask on the last formed semiconductor layer, and implanting dopant ions into a portion of one or more of the semiconductor layers. The sequence of semiconductor layers includes a collector layer, a base layer that is in contact with the collector layer, and an emitter layer that is in contact with the base layer. The implanting uses a process in which the implant mask stops dopant ions from penetrating into a portion of the sequence of layers.

10 Claims, 12 Drawing Sheets

U.S. PATENT DOCUMENTS

| | | | |
|---|---|---|---|
| 6,337,494 B1 | 1/2002 | Ryum et al. | 257/197 |
| 6,362,066 B1 | 3/2002 | Ryum et al. | 438/364 |
| 6,436,781 B2 | 8/2002 | Sato | 438/350 |
| 2002/0192916 A1* | 12/2002 | Naem | 438/309 |

* cited by examiner

BIPOLAR TRANSISTORS WITH VERTICAL STRUCTURES

This application is a divisional of application Ser. No. 11/079,166, filed Mar. 14, 2005 now abandoned, which is a divisional of application Ser. No. 10/243,369, filed Sep. 13, 2002 now U.S. Pat. No. 6,911,716, which is a continuation-in-part of application Ser. No. 10/237,917, filed Sep. 9, 2002 now abandoned.

BACKGROUND

1. Field of the Invention

This invention relates generally to integrated circuits (ICs) and, more particularly, to bipolar transistors with vertical structures.

2. Discussion of the Related Art

Modern compound semiconductor bipolar transistors have vertical structures. In these structures, reducing the base parasitic resistance ($R_{BB}$) and the base-collector capacitance ($C_{BC}$) are important for achieving a higher maximum frequency of oscillation ($f_{max}$), because $f_{max} \approx (f_\tau/[8\pi R_{BB} C_{BC}])^{1/2}$, where $f_\tau$ is the cutoff frequency. Reducing $R_{BB}$ and $C_{BC}$ increases $f_{max}$ and thus, improves transistor performance. In addition, $f_\tau$ will also increase as $C_{BC}$ decreases, since $1/2\pi f_\tau = \tau_b + \tau_c + kT/qI_c$ $(C_{JE}+C_{BC})+(R_{EE}+R_{CC})C_{BC}$. Where $\tau_b$ and $\tau_c$ are the base and collector transit times, $C_{JE}$ is the emitter junction capacitance, $R_{EE}$ and $R_{CC}$ are the extrinsic emitter and collector resistances, k is the Boltzmann constant, T is the absolute temperature, q is the electron charge, and $I_c$ is the collector current.

FIG. 1 shows a mesa vertical structure 10 for a conventional bipolar transistor. The mesa vertical structure 10 is located on a substrate 8 with a high resistance, e.g., iron (Fe) doped indium phosphide (InP). The mesa vertical structure 10 includes collector, base, and emitter layers 14, 16, 18 and collector, base, and emitter electrodes 20, 22, 24. The mesa vertical structure 10 also includes a subcollector contact layer 19. The subcollector contact layer 19 is heavily doped to provide a conducting electrical connection between the collector layer 14 and the collector metal electrode 20.

The base's metal electrode 22 is self-aligned to the emitter metal electrode 24 to reduce the base parasitic resistance. In particular, edge surfaces 26, 28 of the metal electrodes 24, 22 are aligned in the lateral direction, L. Here, L is directed along the surface of the layers 16. The lateral alignment of the emitter and base electrodes 24, 22 minimizes the length of the current pathway in the portion 30 of the base layer 16, which is located in the transistor's extrinsic region 12. Minimizing the length of this current pathway lowers the associated resistance and thus, reduces the base parasitic resistance.

While laterally aligning the edges 26, 28 of the base and emitter electrodes 22, 24 does reduce the base parasitic resistance, the parasitic resistance still increases as device dimensions are vertically scaled down. In particular, thinning the base layer 16 increases the sheet resistance therein. The higher sheet resistance will, in turn, produce a higher base parasitic resistance. Although, thinning the base layer 16 may slightly increase the base-collector capacitance, $C_{BC}$, there is a greater advantage in the reduction of $\tau_b$ to increase both $f_{max}$ and $f_\tau$. Both a higher base parasitic resistance and a higher base-collector capacitance will reduce the maximum frequency of oscillation, i.e., $f_{max}$, of the bipolar transistor. Consequently, even the laterally aligned structure 10 will not produce acceptably low base parasitic resistances and base-collector capacitances as the thickness of the base layer 16 is scaled down.

Plans to scale down feature dimensions in bipolar transistors often include scaling down the thickness of the emitter layer 18 to further reduce the transit time, $f_\tau$. The emitter layer 18 provides vertical electrical isolation between the base and emitter electrodes 22, 24 in the structure 10. In particular, a vertical gap separates these metal contacts 22, 24, and the gap has a width that is equal to the excess thickness, d, of the emitter layer 18 over the thickness of the base electrode 22. As the thickness of the emitter layer 18 scales down, this excess thickness, d, will become insufficient to provide electrical isolation between the base and emitter electrodes 22, 24.

Finally, bipolar transistors are often incorporated into ICs where many devices are fabricated on a substrate and then covered by dielectric and metal interconnect layers. In an IC, a planar device structure is better than a mesa structure for process integration. In particular, via, device and interconnect dimensions can be scaled down for planar structures. Also, lithography is easier, since step heights are smaller in planar structures. A more planar transistor structure also provides better heat dissipation than a mesa structure, because the surrounding regions have a better thermal conductivity if they are a semiconductor, such as InP, rather that a dielectric. The planar structure is desirable for large-scale process integration and device scaling.

As the desire for improved performance pushes for bipolar transistors with yet thinner base and/or emitter layers and yet smaller lateral dimensions, the smaller device dimensions will further exacerbate the above-described problems for the mesa vertical structure 10 of FIG. 1.

SUMMARY

In one aspect, the embodiments provide bipolar transistors whose vertical structures have low base parasitic resistances. The vertical structures include laterally defined intrinsic and extrinsic regions. The transistor's extrinsic region includes a semiconductor base extension that is more heavily doped than the base layer of the transistor's intrinsic region. The heavier doping reduces the base extension's sheet and contact resistances thereby reducing the overall parasitic resistance of the base region of the transistor.

Some embodiments provide bipolar transistors in which base and emitter electrodes are separated by a lateral gap. The low sheet resistance of the base extension makes the base parasitic resistance relatively insensitive to the lateral position of the base electrode on the base extension. For that reason, the lateral gap provides protection against electrical shorts between the emitter and base electrodes without substantially increasing the base parasitic resistance.

In another aspect, the invention provides a method for making a bipolar transistor. The method includes forming a vertical sequence of semiconductor layers that includes a collector layer, a base layer in contact with the collector layer, and an emitter layer in contact with the base layer. The method includes forming an implant mask on the last formed semiconductor layer and then etching the last formed layer to define an intrinsic region of the transistor. The method also includes implanting dopant ions into a portion of one or more of the other semiconductor layers. During the implantation, the implant mask stops dopant ions from penetrating into a lateral portion of the sequence of semiconductor layers.

In yet another aspect, the invention features vertical structures for bipolar transistors with low height profiles and improved heat dissipation properties. In these embodiments, a vertical sequence of semiconductor layers is located on a surface of the semiconductor substrate. The sequence includes the collector, base, and emitter layers that form the functional semiconductor layers of a bipolar transistor. In these embodiments, the substrate includes an area that is more heavily doped and more conductive than surrounding portions of the substrate. The more conductive area is also in contact with and has the same dopant-type as one of the semiconductor layers of the bipolar transistor, e.g., the collector layer. The one of the semiconductor layers includes a heavily doped region that is in contact with the more conductive area of the substrate. The heavily doped region is a conductive channel that provides an electrical connection to the more conductive area of the substrate.

Some embodiments provide a fabrication method for the above-described vertical structure. The fabrication method includes ion implanting a dopant species into a semiconductor substrate to form a more conductive area therein and then forming a sequence of semiconductor layers over the conductive area. The sequence includes a collector layer, a base layer, and an emitter layer for a bipolar transistor. One of the layers has a bottom surface in contact with the more conductive area. The method includes etching away a portion of the two other layers to expose a portion of the one of the layers. The method also includes ion implanting the portion of the one of the layers to form a conductive channel between the underlying more conductive area and a top surface of the exposed portion of the one of the layers.

BRIEF DESCRIPTION OF THE DRAWINGS

FIG. 3a is a flow chart illustrating a method of fabricating a bipolar transistor with the mesa vertical structure of FIG. 2a;

DETAILED DESCRIPTION OF ILLUSTRATIVE EMBODIMENTS

1. Vertical Bipolar Transistor with Improved $f_{max}$

A bipolar transistor with a vertical structure has both intrinsic and extrinsic regions. The intrinsic region refers to a lateral portion with either an NPN or a PNP sequence of semiconductor layers. In the intrinsic region, the sequence includes the collector, base, and emitter layers. The extrinsic region refers to a lateral extension of the intrinsic region with less than all three of the layers of the NPN or PNP sequence.

Herein, a lateral direction refers to a direction along a surface of any of the semiconductor layers of a transistor's intrinsic region.

In a vertical bipolar transistor, the extrinsic region provides an electrical connection to at least the base layer. The structures of the extrinsic region contribute to the base parasitic resistance ($R_{BB}$) and the base-collector capacitance ($C_{BC}$).

Figure 2A:
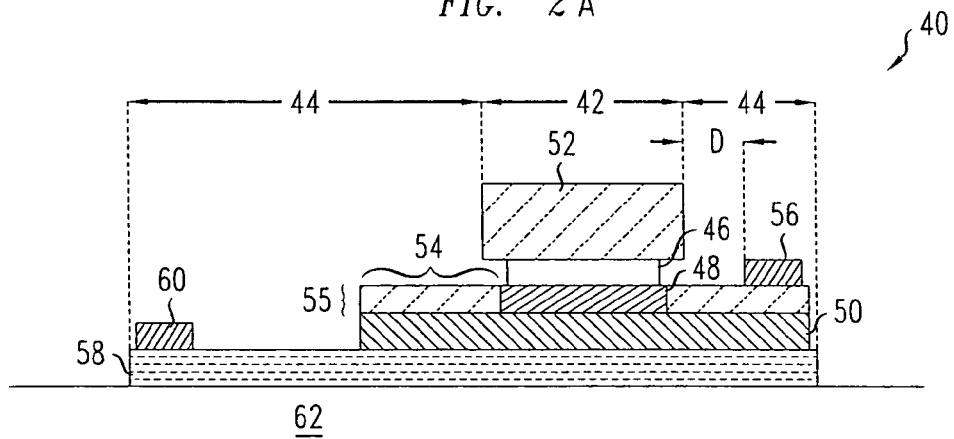
FIG. 2a is a cross-sectional view of a mesa vertical structure for an embodiment of a bipolar transistor with a heavily doped base extension.
Figure 2B:
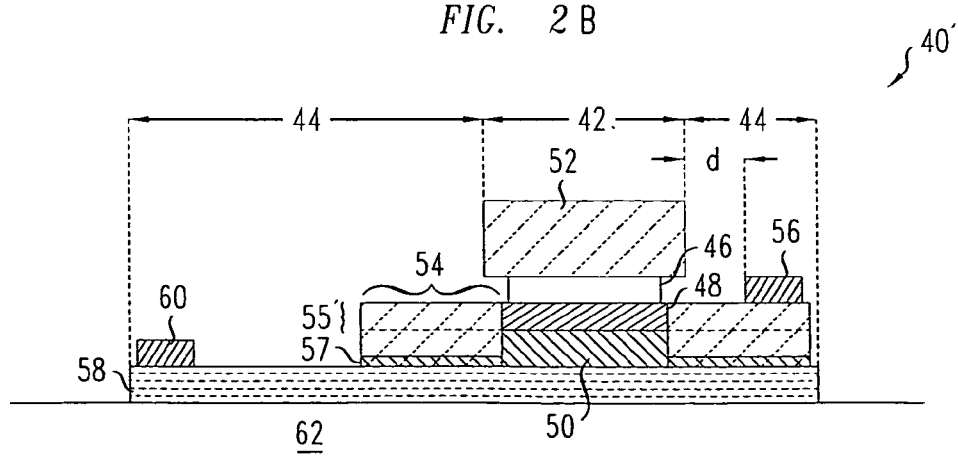
FIG. 2b is a cross-sectional view of another mesa vertical structure for an embodiment of a bipolar transistor with a heavily doped base extension.

FIGS. 2a and 2b illustrate embodiments of vertical structures 40, 40' for bipolar transistors with improved high frequency behavior. The vertical structure 40 of FIG. 2a has a lower base parasitic resistance than similar conventional bipolar transistors lacking an implant doped base extension. The vertical structure 40' of FIG. 2b has both a lower base parasitic resistance and a lower base-collector capacitance than similar conventional bipolar transistors lacking implant doped base extensions extending into the original extrinsic portion of the collector layer.

FIG. 2a shows a cross-sectional view of a mesa vertical structure 40 for a bipolar transistor. The vertical structure 40 includes laterally distinguished intrinsic and extrinsic regions 42, 44. The intrinsic region 42 includes a vertical sequence of semiconductor layers that includes emitter, base, and collector layers 46, 48, 50. The layers 46, 48, and 50 are doped to form the functional structure of an NPN or a PNP bipolar transistor. The base and collector layers 48, 50 of the vertical sequence extend into the extrinsic region 44.

The transistor's extrinsic region 44 includes electrical connections for the base and collector layers 48, 50 of the transistor's intrinsic region 42.

For the base layer 48, the electrical connections include a heavily doped semiconductor layer 54 and an electrode 56, e.g., a patterned metal layer. The electrode 56 is located on the heavily doped semiconductor layer 54.

Herein, a base extension refers to a semiconductor layer of a transistor's extrinsic region. A base extension extends laterally from the base layer of the transistor's intrinsic region and has the same dopant-type as the base layer of the intrinsic region.

For the collector layer 50, the electrical connections include a heavily doped and conductive semiconductor subcollector layer 58 and a collector electrode 60, e.g., a patterned metal layer. The collector electrode 60 is located on the subcollector layer 58. The subcollector layer 58 rests on a substrate 62, e.g., an Fe-doped InP substrate.

For the emitter layer 46, the electrical connections include an emitter electrode 52, which is located in the intrinsic region 42, e.g., a patterned metal layer. In some embodiments, the emitter electrode 52 functions as a mask during fabrication of the base extension as described below.

Herein, the parasitic base resistance is the resistance between the base electrode 56 and the portion of the base layer 48 located in the transistor's intrinsic region 42.

The structure 40 includes a high dopant density in the extrinsic semiconductor region 54, i.e., the base extension. The high dopant density lowers both the sheet resistance of the semiconductor region 54 and the contact resistance between the semiconductor region 54 and the base electrode 56. Both effects lower the base parasitic resistance below values for similar transistors except for a heavily doped base extension, e.g., the transistor of FIG. 1.

The higher conductivity that results from heavily doping the semiconductor region 54 also makes the parasitic base resistance relatively insensitive to the position of the base electrode 56. For this reason, the base electrode 56 can be laterally separated from the emitter electrode 52 by a gap of size "D", e.g., 100 nm or more. Introducing the gap D does not substantially increase the transistor's parasitic base resistance due to the low sheet resistance of the heavily doped semiconductor region 54. The lateral gap does however, provide protection against electrical shorting between the emitter and base electrodes 52, 56.

In the structure 40, the lateral gap enables the emitter layer 46 to be thinner than the base electrode 56 without an electrical short developing between the emitter and base electrodes 52, 56. In the vertical structure 40, the emitter layer 46 may be thinner than the emitter layer 18 of the conventional vertical structure 10 of FIG. 1, because the vertical structure 40 does not have to provide vertical isolation between the base and emitter electrodes 22, 24 due to the lateral gap of size D. Making the emitter layer 46 thinner reduces the overall transit time, i.e., $f_t$, from the emitter layer 46 to the collector layer 50 thereby increasing the upper cutoff frequency of the bipolar transistor associated with the new mesa vertical structure 40.

The high conductivity of the extrinsic semiconductor region 54 also enables using a lower dopant level in that portion of the base layer 48 that is located in the transistor's intrinsic region 42. Reducing the dopant level in the intrinsic portion of the base layer 48 produces a transistor with a higher DC current gain. Due to the high conductivity of the heavily doped extrinsic region 54, the lower dopant level in the intrinsic portion of the base layer 48 does not necessarily produce an unacceptably high base parasitic resistance.

FIG. 2b shows a cross-sectional view of another mesa vertical structure 40' for a bipolar transistor. The structure 40' is substantially identical to the structure 40 of FIG. 2a except for two features. First, the heavy doped base extension 55' is thicker than the base extension 55 of FIG. 2a thereby further lowering the base parasitic resistance in the structure 40'. Second, the portion 57 of the collector layer 50 in the extrinsic region 54 is thinner than in the structure 40 of FIG. 2a. This lowers the base-collector capacitance due to additional carrier depletion by the thicker base extension 55'. The thicker base extension 55' and the thinner extrinsic portion 57 of the collector layer 50 result from the implantation of dopants into extrinsic portions of both the original base layer 48 and the original collector layer 50.

Due to the relatively lower parasitic base resistance and the relatively lower base-collector capacitance, the structure 40' produces a bipolar transistor with an even higher maximum oscillation frequency, $f_{max}$, than the structure 40 of FIG. 2a.

Figure 3A:
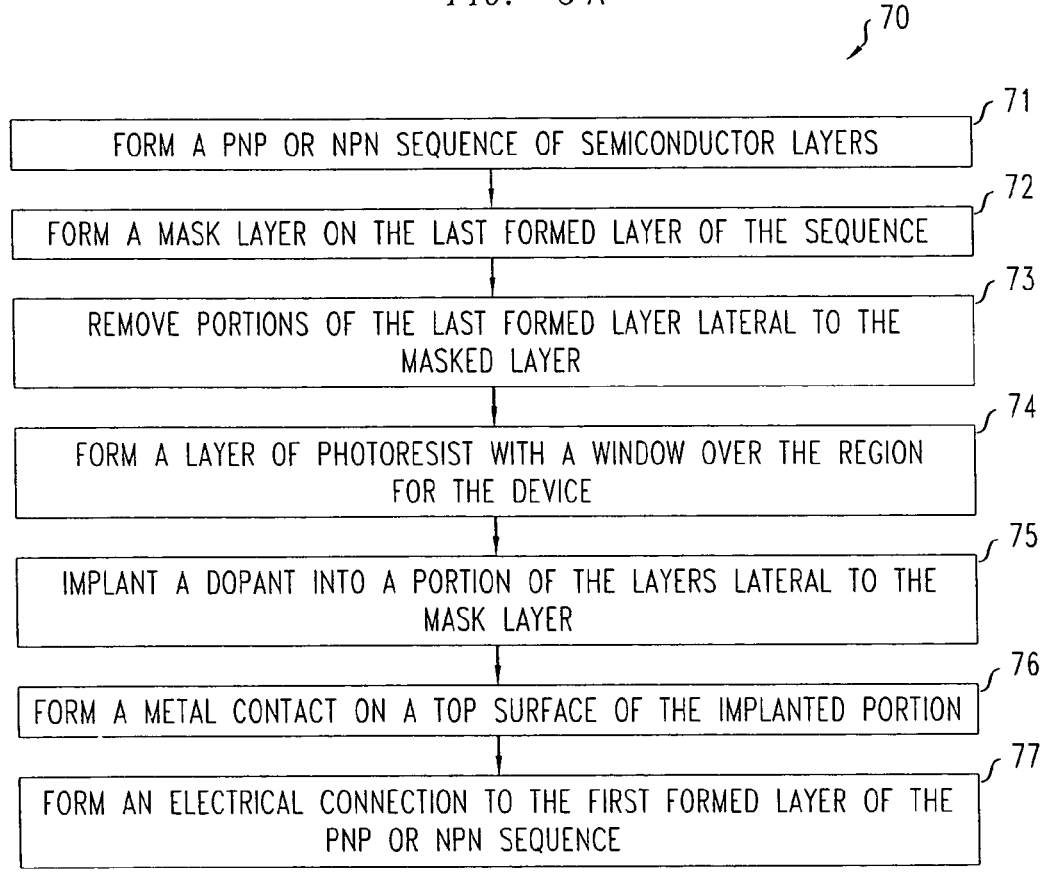

FIG. 3a illustrates a method 70 of fabricating a bipolar transistor with a vertical structure, e.g., the mesa structures 40 and 40' of FIGS. 2a and 2b. The method 70 produces intermediate structures 78, 79 shown in FIGS. 4a-4b.

Figure 4A:
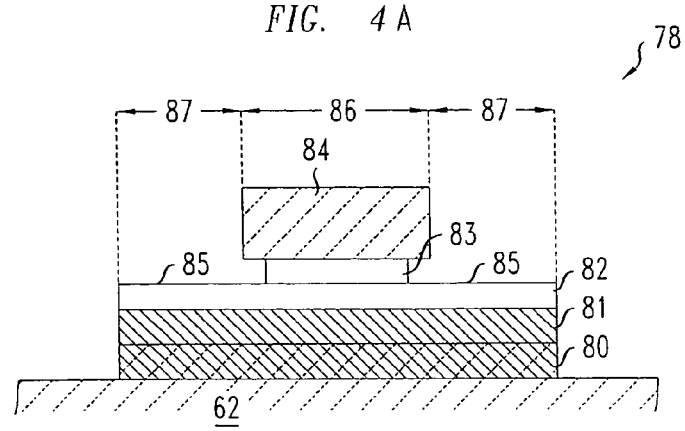
FIGS. 4a and 4b are cross-sectional views of intermediate structures produced while performing the methods of FIGS. 3a and 3b, respectively.

First, method 70 includes fabricating the vertically layered intermediate structure 78 of FIG. 4a. Fabricating the structure 78 includes forming the sequence of functional NPN or PNP semiconductor layers 80-83 for a bipolar transistor (step 71). A sequence of depositions or epitaxial growths forms the NPN or PNP sequence of layers 81-83 on a first layer 80, e.g., a conductive contact sublayer. From bottom to top, the vertical layer sequence is either collector, base, emitter, or emitter, base, collector.

In exemplary embodiments, the layers 80-83 may include different compound semiconductors so that the vertical structure 78 has either a single or a double heterojunction structure. Exemplary compound semiconductors for the layers 80-83 include: gallium arsenide (GaAs), aluminum gallium arsenide (AlGaAs), indium phosphide (InP), indium gallium phosphide (InGaP), indium gallium arsenide phosphide (InGaAsP), indium gallium arsenide (InGaAs), and indium aluminum gallium arsenide (InAlGaAs). Additional exemplary compound semiconductors for the layers 80-83 include: gallium nitride (GaN), indium nitride (InN), aluminum nitride (AlN), aluminum gallium nitride (AlGaN), indium aluminum gallium nitride (InAlGaN), gallium antimonide (GaSb), indium antimonide (InSb), aluminum antimonide (AlSb), aluminum gallium antimonide (AlGaSb), indium aluminum gallium antimonide (InAlGaSb), indium arsenic antimonide (InAsSb), gallium aluminum antimonide (GaAlSb), indium gallium antimonide (InGaSb), and gallium arsenic antimonide (GaAsSb).

Fabricating the vertical structure 78 includes forming an implant mask 84 on the topmost semiconductor layer 83 (step 72). Forming the implant mask 84 includes depositing a single mask layer or multiple mask layer; lithographically forming a patterned mask on the deposited mask layer, performing an etch of exposed material on a top surface of the mask layer, and then removing the patterned mask. Exemplary single and multiple mask layers include metals, dielectrics, e.g., a $Si_3N_4$ or $SiO_2$; refractory metals, e.g., tungsten (W) or WSi; and titanium (Ti) and then gold (Au) over a dielectric. The multiple mask layer of Au and Ti over a dielectric can be removed after the implantation without damaging underlying layers. Evaporation or sputter deposition processes may deposit the dielectric or refractory metal. Plasma-enhanced chemical vapor deposition (PECVD) can also deposit $Si_3N_4$, $SiO_2$, W, or WSi. The implant mask is formed and removed by any lithographic and etch process known to those of skill in the art.

Fabricating the vertical structure 78 also includes removing lateral portions of the last formed semiconductor layer 83 (step 73). The removed portions are located lateral to the implant mask 84. The removal involves performing either an anisotropic etch or an isotropic etch in which the implant mask 84 functions as an etch mask. The etch exposes a top surface 85 of the middle semiconductor layer 82. The exposed top surface 85 is located lateral to the implant mask 84, because the implant mask 84 protects underlying semiconductor from the etchant. The removal step completes fabrication of the intermediate structure 78 of FIG. 4a in which the bipolar transistor's intrinsic and extrinsic regions 86, 87 are physically delineated.

Figure 4B:
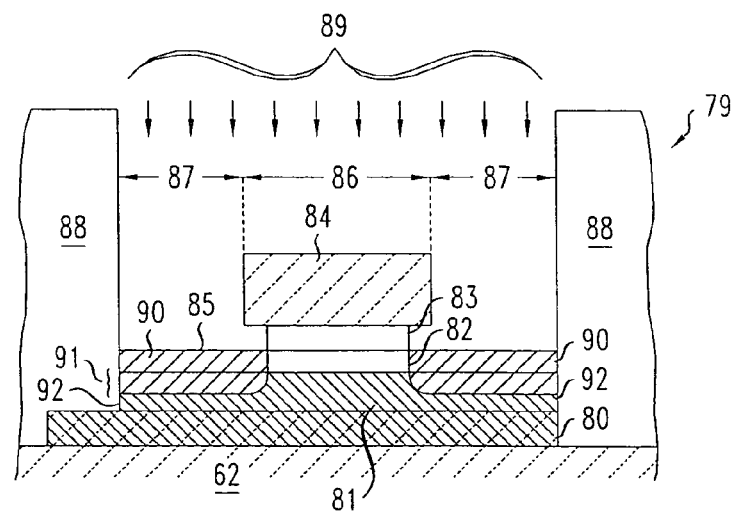

The method 70 also includes forming intermediate structure 79 of FIG. 4b by making a mask material layer 88 on the intermediate structure 78 of FIG. 4a (step 74). The mask material layer 88 has a window over the intrinsic and the extrinsic regions 86, 87, i.e., the lateral region planned for the final transistor. The mask material layer 88 has a thickness and composition sufficient to stop ions that are used in a subsequent treatment. Thus, the layer protects portions of the device that are lateral to the transistor being made.

The method 70 includes performing an ion implantation of a dopant into portions of the semiconductor layers 82, 81 that are located in the extrinsic region 87 (step 75). The implanted dopant has the same dopant-type as the original dopant of the base layer 82.

During the implantation, the implant mask 84 stops the ions 89 from penetrating into the semiconductor layers 81-83 of the intrinsic region 86 due to the short penetration depth of the ions 89 in the material of the implant mask 84. The mask material layer 88 stops the ions 89 from penetrating areas outside of the intrinsic or extrinsic regions 86, 87.

The implantation produces a base extension 90 in which the final dopant density is higher than the original dopant density of the base layer 82, e.g., higher by a factor of 2, 10, 50, or more. Due to the increased concentration of dopant atoms, the base extension has a sheet conductivity that is higher than the sheet conductivity of the original base layer 82. In some embodiments, the ions 89 penetrate in the extrinsic region 87 into the original base layer 82 and into an upper sublayer 91 of the original lowest semiconductor layer 81. In such embodiments, the implantation converts the dopant-type of the implanted sublayer 91 from that of the original lowest semiconductor layer 81 to that of the original base layer 82, i.e., an N-type to P-type change or visa-versa.

The heavily doped base extension 90 forms a high conductivity electrical connection to the portion of the base layer 82 in the intrinsic region 86. The boundaries of the intrinsic region 87 and heavily doped base extension 90 are substantially laterally aligned, because of the implant mask 84. For example, less than about 5 nm of the lower conductivity base layer extends out of the intrinsic region due to the small undercutting of the top layer 83 during step 73. This substantial lateral alignment insures that the low conductivity original base layer 82 forms, at most, a very small part of the conduction path in the base extension 90. The implantation substantially eliminates low conductivity segments in the base layer's connection pathway.

In the base extension 90, the dopant density is high enough to deplete the carrier density in the adjacent unimplanted sublayer 92 of the lowest semiconductor layer 81. The carrier-depletion stops current from flowing between the implanted and unimplanted sublayers 91, 92 of the lowest semiconductor layer 81 when the bipolar transistor operates.

The method 70 also includes depositing a metal electrode 93 on the exposed top surface 85 of the base extension 90 (step 76). The deposition uses a mask to control lateral deposition of the metal electrode 93. Preferably, the mask will produce a lateral gap of nonzero size "D" between the metal electrodes for the topmost and base semiconductor layers 83, 82. The gap D is preferably large enough so that the base electrode 93 and final electrode (not shown) to the topmost layer 86 are not even approximately laterally aligned, i.e., to provide electrical isolation therebetween.

The method 70 also includes forming, in the extrinsic region 87, an electrical connection for the earliest formed or lowest semiconductor layer 81 of the NPN or PNP sequence (step 77). Exemplarily, forming this electrical connection includes depositing a metal electrode on a previously formed a heavily doped and conducting semiconductor sublayer, i.e., the layer 80.

Figure 3B:
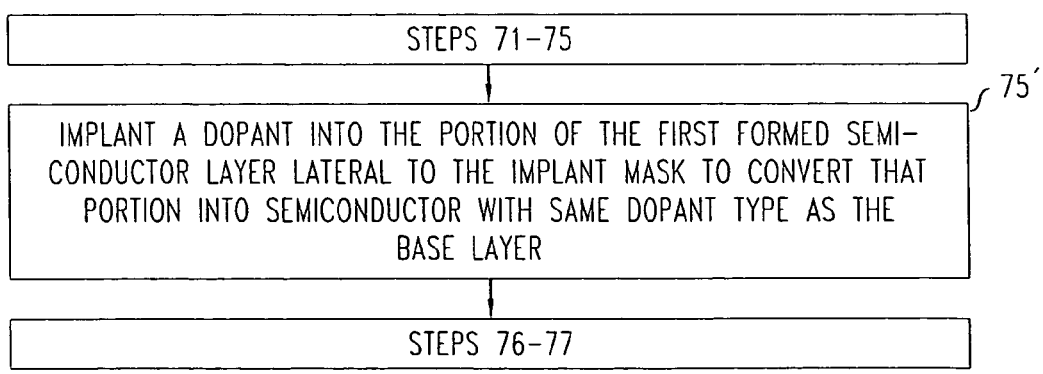
FIG. 3b is a flow chart illustrating a method of fabricating the bipolar transistor with a lower mesa vertical structure of FIG. 2b.

FIG. 3b illustrates a method 70' for fabricating the vertical structure 40' of the bipolar transistor shown in FIG. 2b. In the method 70', steps 71-75 have already been described with respect to FIG. 3a. The method 70' also includes performing a second ion implantation of a dopant into portions of the original collector layer 50 that are located lateral to the implant mask 84 of FIG. 4b (step 75'). The dopant energies are higher in step 75' so that the dopant penetrates more deeply, i.e., into the extrinsic portion of the original collector layer 50. This second implantation has a dose is sufficient to convert the implanted portion of the collector layer to the dopant-type of the base layer 48. As a result, the method 70' produces a vertical structure 40' in which the heavily doped base extension 54 is thicker and the extrinsic portion 57 of the collector layer 50 with an unconverted dopant-type is thinner than in the structure 40 of FIG. 2a. These features provide for further reduction of the $C_{BC}$ in the final device.

EXAMPLE 1

1. Heavily Doped Base Extension

An exemplary embodiment of method 70 of FIG. 3 produces an NPN double heterojunction bipolar transistor (DHBT).

To start the fabrication of the NPN DHBT, metal organic molecular beam epitaxy (MOMBE) is used to grow a vertical sequence of semiconductor layers on a doped InP substrate. From bottom-to-top the produced vertical sequence includes: an N-type InGaAs subcollector contact layer, an N-type InP collector layer, a P-type InGaAs base layer, and an N-type InP emitter layer. The dopants are: carbon or beryllium for the P-type layer and silicon or tin for the N-type layers. During the MOMBE, the epitaxy gas mixture changes to sequentially produce the appropriately N-type and P-type doped semiconductor layers for the NPN DHBT.

The sequence of MOMBE growths produces a vertical layer sequence in which the InP collector, InGaAs base, InP emitter, and InGaAs subcollector layers have the below-described properties. The InP collector layer has a thickness in a range of about 100 nm to about 500 nm and about $1\times10^{16}$ to about $4\times10^{17}$ N-type dopant atoms per centimeter cubed ($cm^3$). The base layer has a thickness between in a range of about 10 nm to about 100 nm and about $1\times10^{19}$ to about $1\times10^{20}$ P-dopant atoms per $cm^3$. Preferably, the base layer has a thickness of about 30 nm. The InP emitter layer has a thickness of about 40 nm to about 100 nm and about $2\times10^{17}$ to about $1\times10^{19}$ N-dopant atoms per $cm^3$. Preferably, the emitter layer has about $5\times10^{17}$ to about $5\times10^{18}$ N-type dopant atoms per $cm^3$. The InGaAs subcollector layer has about $10^{19}$ or more N-type dopant atoms per centimeter cubed ($cm^3$) and is thick enough to obtain a sheet resistance of less than 10 ohms per square.

After producing the vertical sequence of semiconductor layers, an implant mask is formed on the topmost semiconductor layer by one of three alternative processes. The first process produces a patterned Au—Ti implant mask. Making the Au—Ti implant mask includes performing a plasma enhanced chemical vapor deposition (PECVD) to deposit about 50 nm silicon nitride ($Si_3N_4$) layer, forming a photoresist mask layer on the silicon nitride layer, depositing 5 nm of titanium (Ti). then depositing 150 nm of gold (Au) on the photoresist mask layer, and stripping the photoresist mask layer. The second process produces a patterned dielectric layer by conventional deposition, mask, and etching methods. Exemplary dielectric layers include about 50 nm to about 100 nm of silicon nitride or silica glass. The third process includes forming a patterned layer of refractory metal by conventional deposition, masking, and etching methods. Exemplary refractory metal mask layers include about 50 nm to about 100 nm of tungsten (W) or tungsten silicide (WSi).

After completion of the implant mask, an etch removes portions of the emitter layer, which are located lateral to the implant mask. During the etch, the implant mask functions as an etch mask by stopping semiconductor, which is located under the mask, from being removed. The etch continues until a top surface of the base layer has been exposed in the region lateral to the implant mask. The etch delineates the device's lateral intrinsic and extrinsic regions.

Exemplary etches include conventional dry and wet etches for InP. One wet etch uses an aqueous solution that includes $HCl/H_3PO_4/H_2O$ in equal volume parts. This solution is capable of exposing the lateral surface of the base layer without causing more than about 5 nm of undercutting of the portion of the emitter layer that is located below the implant mask.

After the etch, a deposition produces a 50 nm thick conformal layer of silicon nitride. The conformal layer produces sidewalls over exposed surfaces of the emitter layer thereby protecting the emitter layer during a subsequent non-normal ion implantation.

Next, a co-implantation of phosphorous (P) and a P-type dopant, such as magnesium (Mg), zinc (Zn), or beryllium (Be) produces a heavily doped base extension in the device's extrinsic region. The implantation raises the concentration of P-type dopants to be 2-10 or more times higher than the original dopant concentration in the base layer. The co-implantation of both a P-type dopant and P improves dopant activation over that achieved by implanting a P-type dopant alone.

The co-implantation is a two-step process. The first step, the process implants a dose of about $2\times10^{14}/cm^2$ of 25 kilo electron volt (keV) Mg ions. In the second step, the process implants an equal dose of 40 keV P ions. In each step, the impacting ions have 7° tilt with respect to the normal to the surface of the exposed extrinsic portion of the base layer. The tilt lowers the probability that ions will channel through the crystal. The tilt does not cause ion implantation in the emitter layer, because the thin silicon nitride sidewall stops ions impacting thereon at low angles.

The two-step implantation produces a base extension that is between about 30 nm and about 80 nm thick. The base extension can be thicker than the original base layer, e.g., a 30 nm thick layer, provided that implantation does not dope, at least, a 30 nm thick sublayer of the original portion of the collector layer. Preferably, the unimplanted N-type sublayer of the original collector layer is 100 nm or more thick. The heavily doped base extension will deplete the carrier population in the adjacent unimplanted sublayer of the collector layer. The carrier depletion will impede current leakage between the base extension and the subcollector layer during operation of the final bipolar transistor.

The implantation progresses under the control of an implant mask that is located on the emitter and a second mask located outside the region for the transistor being made. The implant mask preferably has a thickness of about 100 nm or more in order to stop the Mg and P ions from penetrating into the intrinsic region. The emitter implant mask self-aligns the inner lateral boundary of the base extension on the lateral boundary of the intrinsic region. The second mask is a lithographically patterned layer of silicon nitride. The layer of silicon nitride has a window that restricts implantation of dopants to the particular transistor's footprint.

After the implantation, a rapid thermal anneal activates the implanted dopants of the base extension. The activated dopants occupy lattice sites in the semiconductor matrix. The rapid thermal anneal is performed at a temperature of about 750° C. to about 850° C. for a duration of about 5 to about 15 seconds. The anneal completes the formation of the heavily doped base extension.

After completing the base extension, the exemplary method includes forming metal electrodes for both the base and collector layers.

Forming the base electrode includes depositing a layer of metal Pd, Pt, and Au on a top surface of the base extension. The deposition proceeds under the control of lithographically patterned layer of photoresist that defines the lateral extent of the final base electrode. The deposition may also add metal to an emitter electrode, i.e., if the implant mask is replaced by an electrode prior to formation of the base electrode. Preferably, the patterned mask layer produces a lateral gap between the base electrode being deposited and the emitter electrode, e.g., a gap of 10 nm or more, because such a lateral gap will reduce the risk of base/emitter shorts.

Forming the collector's electrode includes performing a mask-controlled wet or dry etch of a portion of the base and collector layers to expose a top surface of the subcollector layer in the extrinsic region. The etch uses any conventional dry or wet etch chemistry for InP and InGaAs. For example, the etch may use a solution that includes water, HCl, and $H_3PO_4$ in 1:1:1 volume parts or a solution that includes water, $H_2O_2$, and $H_3PO_4$ in 15:1:1 volume parts. After the etch, a mask-controlled deposition forms a Pd, Pt, and Au electrode on the exposed top surface of the subcollector layer.

After completing formation of the metal electrodes for the base and collector layers, the exemplary method completes the fabrication of the device. Completing the fabrication includes depositing a dielectric passivation layer such as polyimide or benzocyclobutane, forming electrodes through the passivation layer to the bipolar transistor, and forming a metallization layer that connects the bipolar transistor to other circuit elements on the same substrate, i.e., if such elements are present. Methods for performing these processes are known to those of skill in the art.

2. Incorporating Vertical Bipolar Transistors into ICs

Other embodiments provide planar vertical structures for bipolar transistors with low height profiles and good heat dissipation properties. The low height profiles improve planarization properties and packing densities for such structures. The good heat dissipation enables better cooling of such structures during operation.

Figure 5:
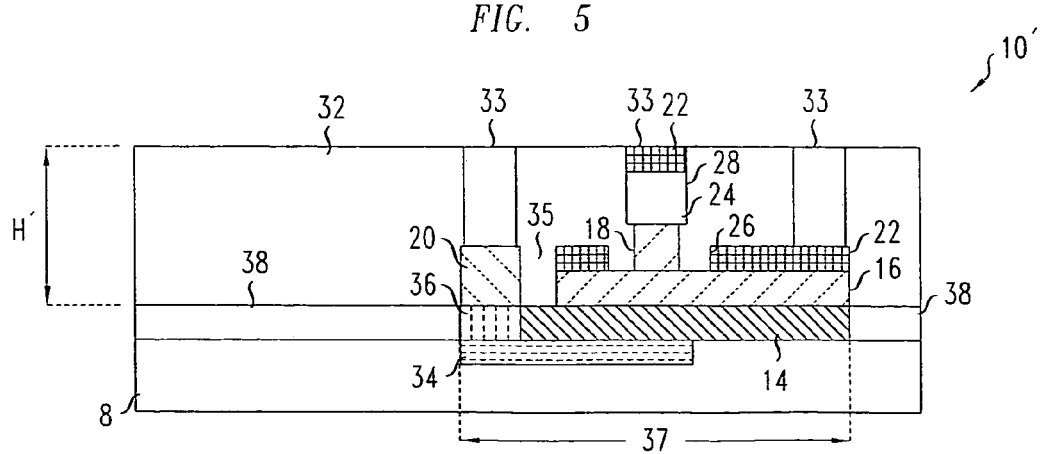
FIG. 5 is a cross-sectional view of a planar vertical structure for a bipolar transistor located on a substrate with a conducting subcollector area.

FIG. 5 shows one such planar vertical structure 10' for a bipolar transistor. The planar vertical structure 10' includes a sequence of semiconductor layers 14, 16, 18 that function as the collector, base, and emitter of the bipolar transistor. The sequence of semiconductor layers 14, 16, 18 rests directly on semiconductor substrate 8. Thus, unlike the conventional mesa vertical structure 10 of FIG. 1, the vertical structure 10' does not include a separate heavily doped subcollector layer 19. The vertical structure 10' also includes collector, base, and emitter electrodes 20, 22, 24, e.g., metal layers. The base and emitter electrodes 22, 24 have edges 26, 28 that are laterally aligned.

Instead of a separate subcollector layer, the vertical structure 10' includes a heavily doped subcollector area 34 in the substrate 8. The subcollector area 34 is more heavily doped than surrounding regions of the substrate to provide a highly conductive electrical connection to the collector layer 14. In particular, the heavily doped subcollector area 34 functions as a conductor rather than as a semiconductor. The subcollector area 34 is also in contact with a heavily doped portion 36 of the collector layer 14. The heavily doped lateral portion 36 forms a conducting channel that electrically connects the subcollector area 34 to the collector electrode 20. The heavy doping also causes the lateral portion 36 to function as a conductor rather as a semiconductor. The subcollector area 34 and lateral portion 36 have the same dopant-type, i.e., N-type or P-type, as the intrinsic portion of the collector layer 14. The collector electrode 20 is insulated from the base layer 16 by a lateral gap 35.

A portion 38 of the collector layer 14 is located outside of transistor's footprint region 37. The portion 38 has a low conductivity, i.e., the portion functions as an insulator, and thus, provides electrical insulation between the vertical structure 10' and other devices (not shown) on the substrate 8. The low conductivity of the portion 38 results either from implant doping or implant damage.

Figure 1:
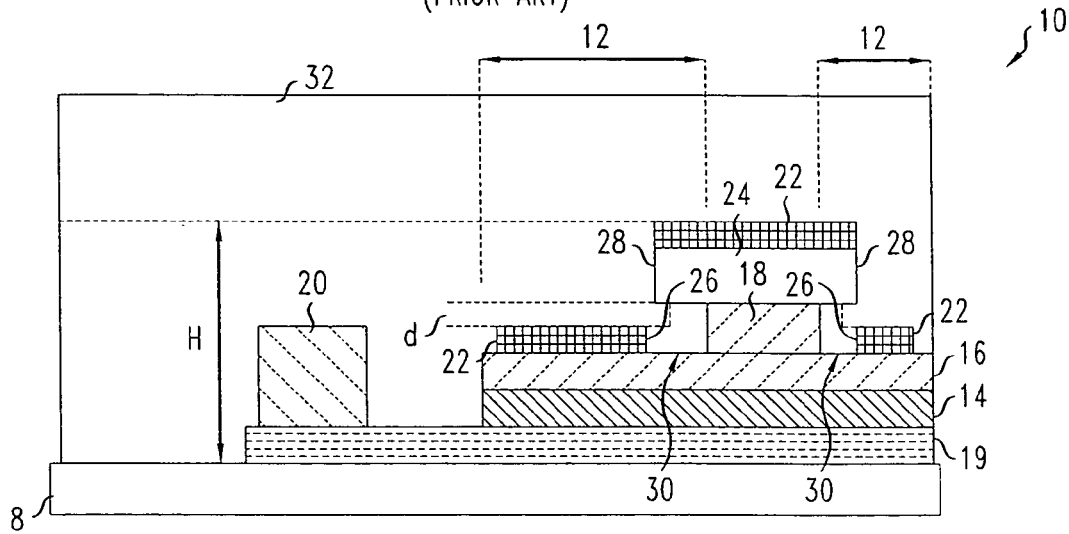
FIG. 1 is a cross-sectional view of a mesa vertical structure for a conventional bipolar transistor.

The vertical structure 10' has a lower and less complex height profile than the conventional mesa vertical structure 10 of FIG. 1. The lower height profile results, in part, from the absence of separate subcollector layer 19, which is shown in FIG. 1. The lower height profile also results, in part, from sharing the same collector layer 14 with adjacent devices. The lower height profile enables better planarization of the portion of the protective dielectric layer 32 over the vertical structure 10' and adjacent regions in an IC.

The vertical structure 10' also more efficiently dissipates heat during operation than the conventional vertical structure 10 of FIG. 1. The more efficient heat dissipation results, in part, from the higher thermal conductivity of the heavily doped InP subcollector area 34 as compared to the thermal conductivity of the InGaAs subcollector contact layer 19 of FIG. 1. The improved heat dissipation also results, in part, from the lower height profile of the planar vertical structure 10' as compared to the height profile of the mesa vertical structure 10 of FIG. 1. The lower height profile provides a shorter pathway for heat to dissipate through the thermally conductive substrate 8.

Figure 6:
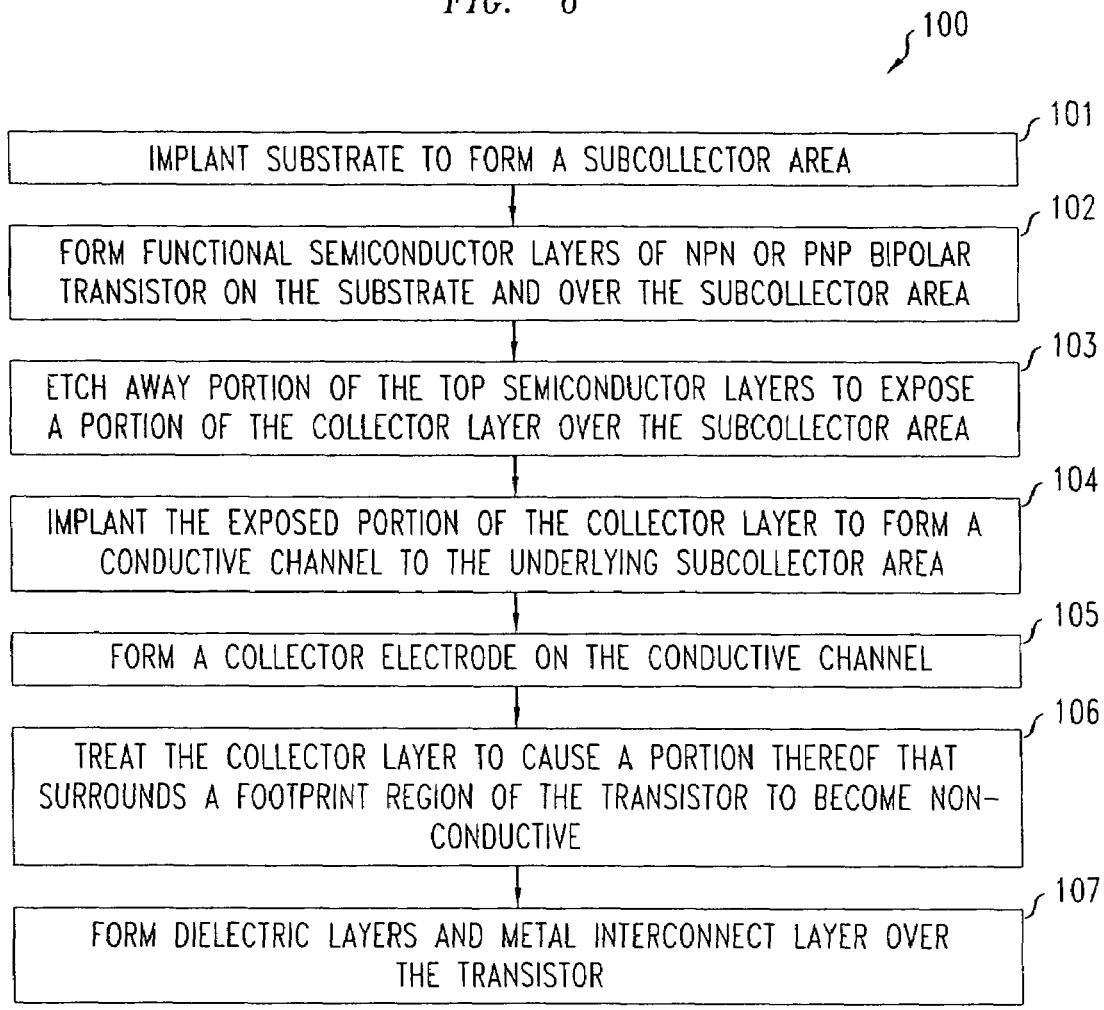
FIG. 6 is a flow chart that illustrates a method for fabricating the vertical structure of FIG. 5.

FIG. 6 illustrates an embodiment of a method 100 for fabricating the vertical structure 10' of FIG. 5.

The method 100 includes forming the heavily doped subcollector area 34 by ion implanting a dopant into substrate 8 (step 101). The implantation makes the subcollector area 34 more conductive than surrounding portions of the substrate 8. During the ion implant, an implant mask controls the lateral extent of the area being implanted.

The method 100 also includes forming a sequence of functional semiconductor layers 14, 16, 18 for an NPN or PNP bipolar transistor (step 102). Here, the layers 14, 16, and 18 are formed directly on the substrate 8. e.g., by metal organic molecular beam epitaxy. The sequence of collector, base, and emitter layers 14, 16, 18 rests directly on the substrate 8 and over the subcollector area 34. The collector layer 14 and the subcollector area 34 have the same dopant-type, i.e., N-type or P-type.

The method 100 also includes etching away a lateral portion of the emitter and base layers 18, 16 to expose a top surface of a portion 36 of the collector layer 14 in the structure's extrinsic region (step 103). The exposed portion 36 is vertically above the conducting subcollector area 34.

The method 100 includes heavily ion implanting the exposed portion 36 of the collector layer 14 to produce a conducting channel between the subcollector area 34 and the exposed top surface of the collector layer 14 (step 104). Then, a collector electrode 20 is fabricated on the top surface of the implanted portion 36 (step 105).

The method 100 also includes treating the collector layer 14 to cause a portion 38 thereof to become non-conductive (step 106). The treated portion 38 surrounds the device's footprint region 37 and provides electrical insulation between the vertical structure 10' and other devices (not shown) on the substrate 8. Exemplary treatments involve implanting traps, such as deep-level dopants, into the portion 38 of collector layer 14 or implant damaging the portion 38 of the collector layer 14. By making the portion 38 of the collector layer 14 nonconductive, it is possible to electrically insulate the vertical structure 10' without increasing the height profile of the vertical structure 10'.

Finally, the method 100 includes forming one or more protective dielectric layers 32 and one or more metal interconnect layers 33 over the vertical structure 10' (step 107). Processes for making such dielectric and metal interconnect layers are well-known to those of skill in the art. The interconnect layers 33 electrically connect the electrodes 20, 22, 24 of the bipolar transistor to other devices (not shown) on the substrate 8.

EXAMPLE 2

FIGS. 7-18 illustrate structures produced by an exemplary method for fabricating a vertical heterojunction bipolar transistor (HBT) on an IC. The method produces an HBT with a low height profile and good heat dissipation properties.

Figure 7:
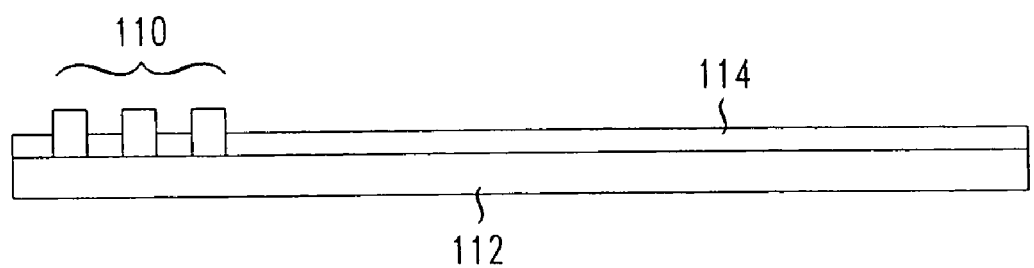
FIGS. 7-17 are cross-sectional views of intermediate structures produced by an exemplary method that incorporates the bipolar transistor of FIG. 5 into an IC.

Referring to FIG. 7, the method includes providing an indium phosphide (InP) substrate 112 and forming indium gallium arsenide (InGaAs) marks 110 for aligning the HBT on the IC's substrate 112. The substrate 112 is doped with iron (Fe) so that it is non-conductive. The formation of the alignment marks 110 includes depositing a 300 nm or thicker InGaAs layer on the InP substrate 112. A conventional mask-controlled InGaAs etch produces the alignment marks 110 from the InGaAs layer.

The method also includes performing a PECVD of a protective silicon nitride ($Si_3N_4$) layer 114 on the InP substrate 112. The PECVD deposition is performed at a temperature of about 250° C. and stops after about 50 nm of $Si_3N_4$ has been deposited.

Figure 8:
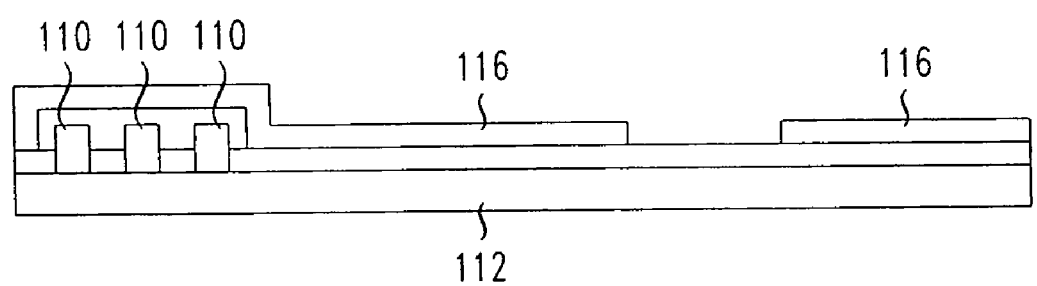

Referring to FIG. 8, the method includes forming a patterned gold-titanium (Au—Ti) mask 116 on the $Si_3N_4$ layer 114. The Au—Ti mask 116 controls a subsequent ion implant. Forming the Au—Ti implant mask includes forming a photoresist mask to control subsequent metal depositions, performing an evaporation-deposition of a 5 nm thick Ti layer on the $Si_3N_4$ layer 114, performing an evaporation-deposition of a 150 nm thick Au layer on the Ti layer, and then stripping the photoresist mask.

Figure 9:
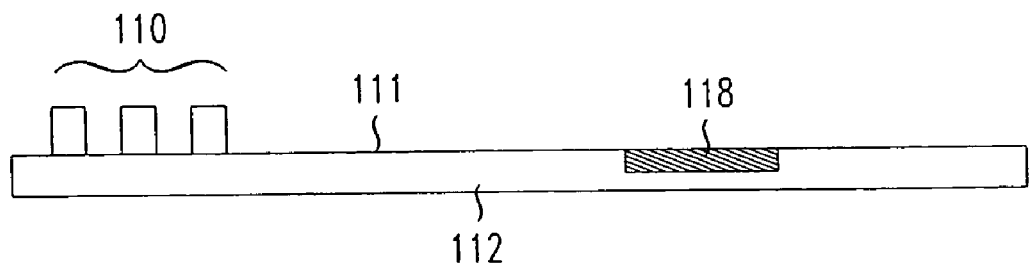

Referring to FIG. 9, the method includes ion implanting a dopant into a subcollector area 118 of the InP substrate 112. The ion implant introduces N-type dopant atoms into the InP substrate 112, e.g., sulfur (S) atoms. The implant conditions are: S-ion energy of about 50 keV to about 350 keV, about 7° tilt of the implant angle from the normal direction to surface 100, a dose of about $2 \times 10^{14}$ to about $1 \times 10^{15}$ S atoms per $cm^{-2}$, and a substrate temperature of about 300° C. A conventional etch removes the implant mask 116 after the S-ion implantation is completed.

The method also includes performing a 5 to 15 second anneal at about 750° C. to about 850° C. to activate the implanted N-type dopants, i.e., the S atoms. After activation, the subcollector area 118 has a conductivity that is 100-100,000 or more times the conductivity of surrounding portions of the substrate 112. After the anneal, a conventional etch removes the protective $Si_3N_4$ layer 114.

The method includes depositing a protective cap of about 500 nm of $SiO_2$ over the device's alignment marks 110. The $SiO_2$ cap protects the alignment marks during subsequent steps.

Figure 10:
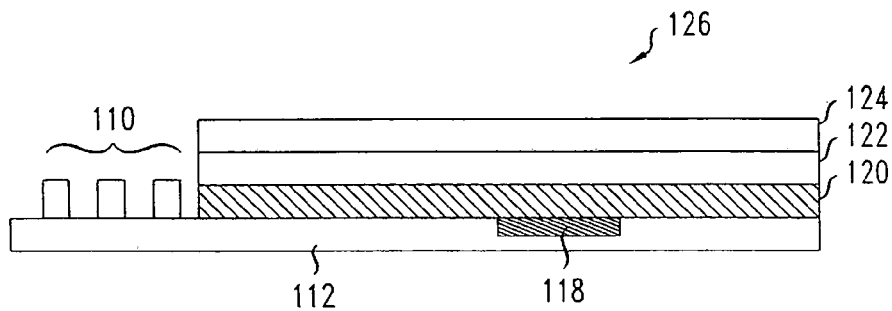

Referring to FIG. 10, the method includes performing an epitaxial growth to sequentially produce a 150 nm thick N-type InP collector layer 120, a 30 nm thick P-type InGaAs base layer 122, and a 75-100 nm thick N-type InP emitter layer 124. The semiconductor layers 120, 122, 124 form a double heterojunction bipolar transistor (DHBT) structure. After growing the DHBT structure, a conventional BOE (7:1) etch removes the protective cap over the device alignment marks 110 thereby producing intermediate structure 126.

Figure 11:
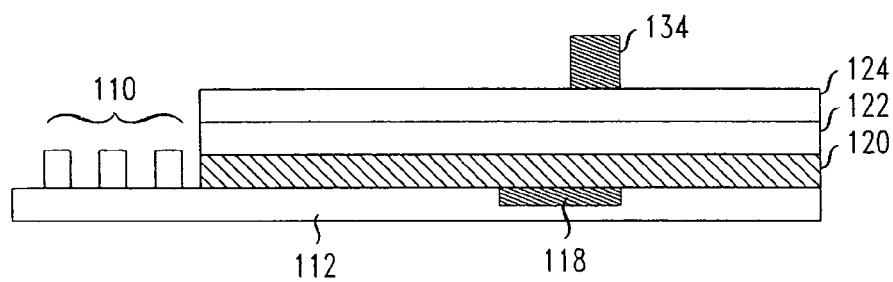

Referring to FIG. 11, the method includes performing a conventional mask-controlled metal deposition to produce an emitter electrode 134 on the emitter layer 124. The emitter electrode 134 is positioned to be directly above a portion of the subcollector area 118.

Figure 12:
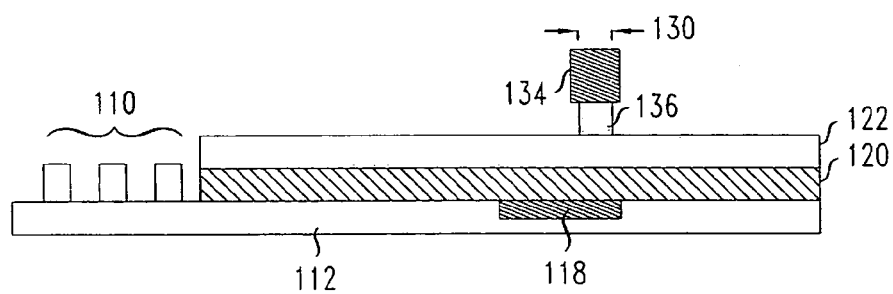

Referring to FIG. 12, the method includes performing a wet etch to remove lateral portions of the emitter layer 124 thereby defining the HBTs intrinsic region 130. During the wet etch, the metal emitter electrode 134 functions as an etch mask. The wet etch typically undercuts the emitter electrode 134 by 150 nm or less. After the wet etch portion 136 of the original emitter layer 124 remains.

Figure 13:
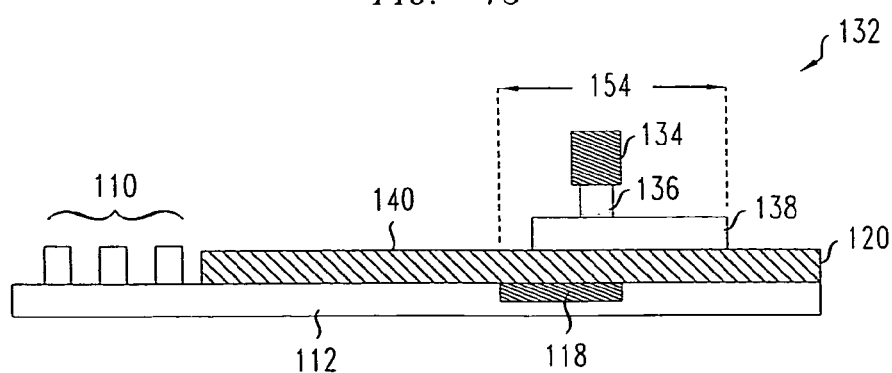

Referring to FIG. 13, the method includes performing a mask-controlled wet or dry etch for InP to remove lateral parts of the base layer 122. The etch leaves a portion 138 of the original base layer 122. The etch exposes a portion of a top surface 140 of the collector layer 120. The exposed portion includes an area that is located vertically over the heavily doped subcollector area 118.

Figure 14:
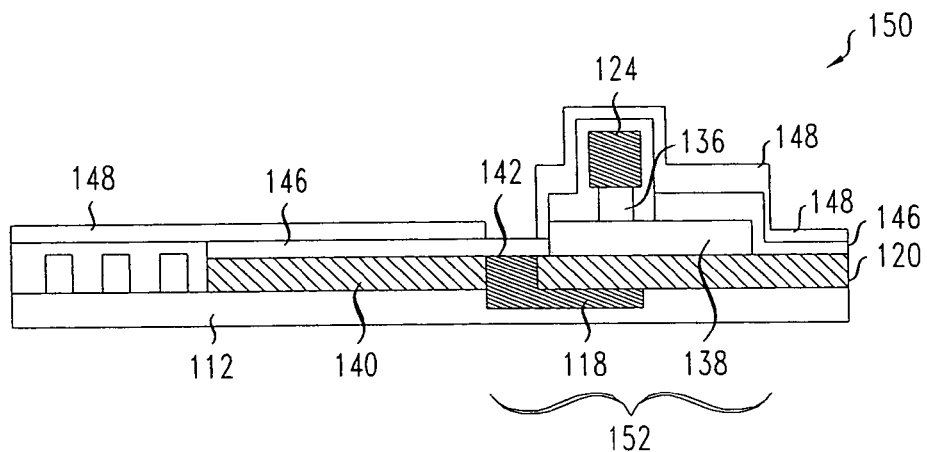

Referring to FIG. 14, the method includes performing a multi-step process to fabricate a conducting channel 142 between the subcollector area 118 and the exposed top surface 140 of the collector layer 120. The channel 142 has a conductivity that is 10 or more times larger than the conductivity of portions of the collector layer 120 in the intrinsic region. The process includes performing a PECVD to form a protective layer 146 of about 50 nm of $Si_3N_4$ on the structure 132 of FIG. 13. The process includes forming a Au—Ti implant mask 148 by the method used to form the Ti—Au implant mask 116 of FIG. 8. The process includes implanting a dose of about $2 \times 10^{14}$ to about $1 \times 10^{15}$ S-atoms per $cm^{-2}$ into the unmasked portion of the collector layer 120. The S ions have energies of about 50 keV to about 150 keV and impact at a 7° tilt angle with respect to the normal to surface 140. After the implant, the implant mask 148 is removed by the etch process used to remove the Au—Ti mask 116 of FIG. 8.

After the implant, an anneal at about 750° C. to about 850° C. and for about 5 to 15 seconds activates the implanted S atoms. Finally, the same process that removed $Si_3N_4$ layer 114 of FIGS. 7-8 is used to remove the protective $Si_3N_4$ layer 146.

Figure 15:
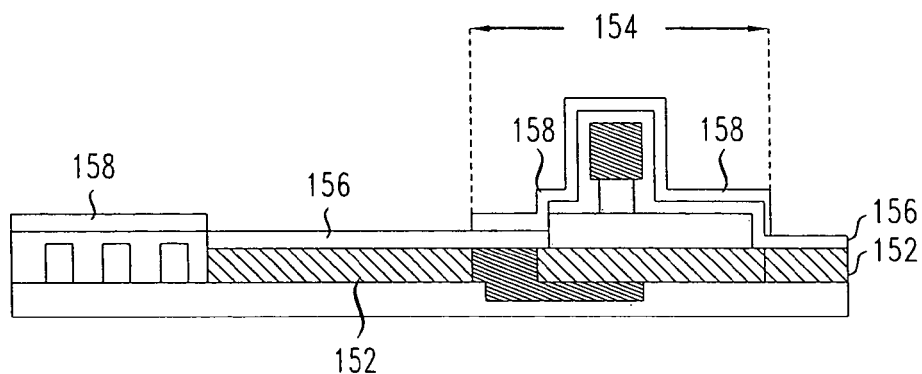

Referring to FIG. 15, the method includes performing a multi-step treatment of a portion 152 of the collector layer 120 that surrounds the DHBT's footprint region 154. The treatment makes the portion 152 non-conductive thereby electrically insulating the DHBT from other devices (not shown) on the substrate 8. The treatment includes performing a PECVD to form a protective $Si_3N_4$ layer 156. The treatment also includes forming a Au—Ti implant mask 158 on the $Si_3N_4$ layer 156 by the same method used to form the Ti—Au implant mask 116 of FIG. 8. The Au—Ti implant mask 158 covers the whole surface except the portion 152 of the collector layer 120. The treatment includes performing a damaging implant to lower the conductivity of the portion 152 of the collector layer 120. The damaging implant either causes lattice damage or introduces carrier traps into portion 156 of the collector layer 120. Exemplary damaging implants use a dose of about $2 \times 10^{14}$ to about $1 \times 10^{15}$ O, Fe, B, Ti, or He ions per $cm^{-2}$. The damaging ions have 10 keV to 400 keV energies. After the damaging implantation, the Au—Ti implant mask 158 and the protective $Si_3N_4$ layer 156 are removed by the same etch processes used to remove the Au—Ti implant mask 116 and the $Si_3N_4$ layer 114 of FIG. 8.

Figure 16:
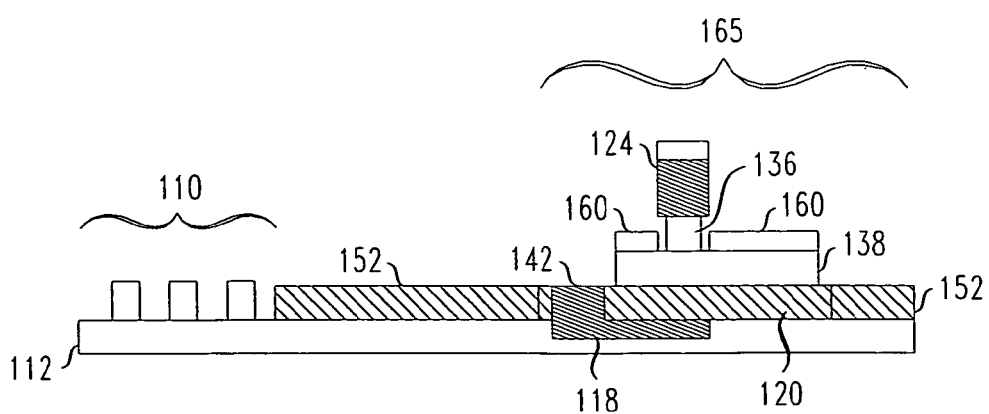

Referring to FIG. 16, the method also includes performing a conventional deposition to produce base electrode 160. During the deposition, the emitter electrode 124 functions as a mask so that the base electrode is laterally aligned on the emitter electrode 124.

Figure 17:
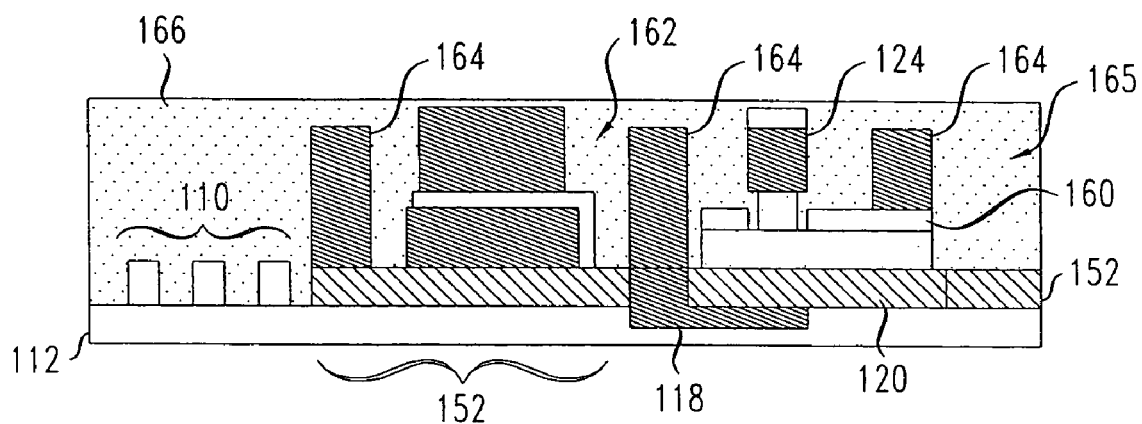

Referring to FIG. 17, the method includes performing conventional processes to fabricate passive devices 162, e.g., capacitors and resistors; metal plugs and interconnect 164; and protective dielectric layers 166. Exemplary protective dielectric layers 166 include benzocyclobutane (BCB), which can be spun-on the IC and then planarized. Due to the low height profile of the planar vertical structure for the DHBT, spun-on BCB better covers and better planarizes the vertical structure 165 of FIG. 16 than the conventional vertical structure 10 of FIG. 1.

Figure 18:
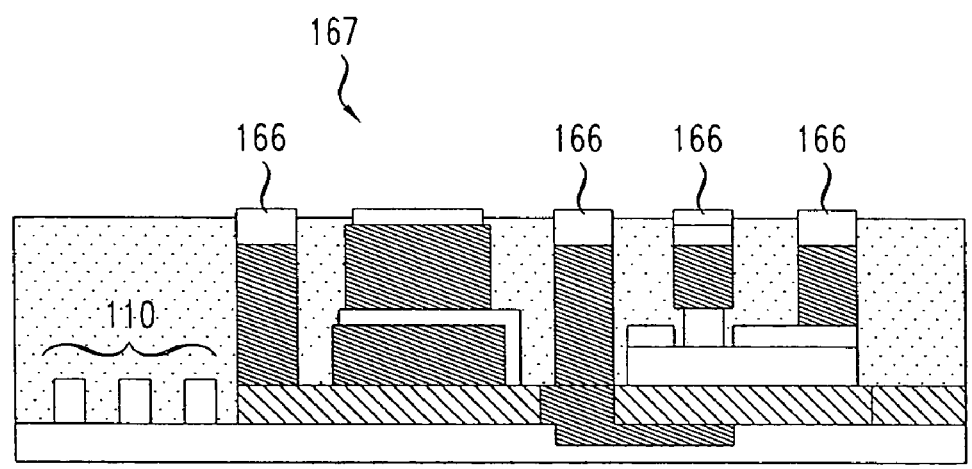
FIG. 18 is a cross-sectional view of the transistor produced from the intermediate structures of FIGS. 7-17.

Referring to FIG. 18, the method also includes forming vias and filling the vias with metal to produce electrodes 166 in the final IC 167.

EXAMPLE 3

FIGS. 19-26 illustrate an alternate method for fabricating a vertical structure for an DHBT on an IC. The alternate method produces a vertical structure for an DHBT with a heavily doped base extension. In addition to having a low parasitic base resistance like the bipolar transistors of FIGS. 2a and 2b, these new DHBTs also have low height profiles and improved heat dissipation like the planar vertical structure 10' of FIG. 5.

Figure 19:
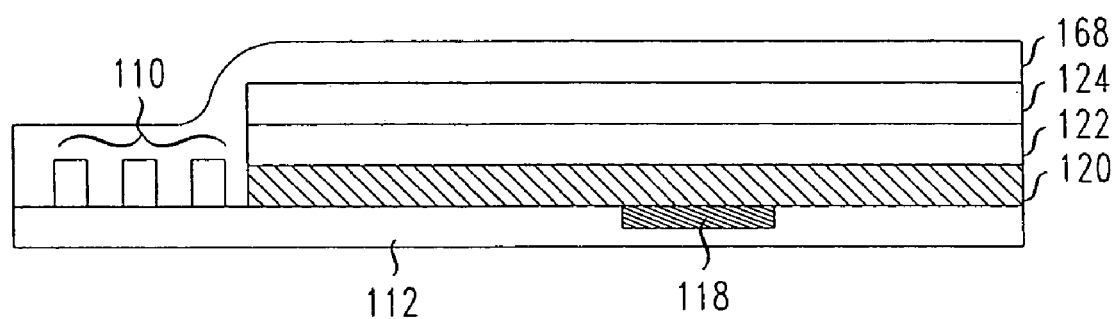
FIGS. 19-29 are cross-sectional views of intermediate structures produced by an alternate method that incorporates the bipolar transistor of FIG. 5 into an IC.

Referring the FIG. 19, the alternate method includes forming a $SiO_2$ dummy emitter on the intermediate structure 126 of FIG. 10. To form the dummy emitter, a PECVD deposits a $SiO_2$ layer 168 with a thickness of about 500 nm on the sequence of semiconductor layers 120, 122, 124 while the substrate 112 is maintained at about 250° C. Then, a mask-controlled plasma etch of the $SiO_2$ layer 128 laterally defines $SiO_2$ dummy emitter 170, which is shown in FIG. 20.

The alternate method uses $SiO_2$ dummy emitter 170 as a mask during a wet etch of the N-type InP emitter layer 124. Preferably, the wet etch of the N-type InP emitter layer 124 undercuts the $SiO_2$ dummy emitter cap 134 by about 150 nm. The wet etch produces the final emitter 136 thereby defining the lateral extent of the DHBT's intrinsic region 130.

Figure 20:
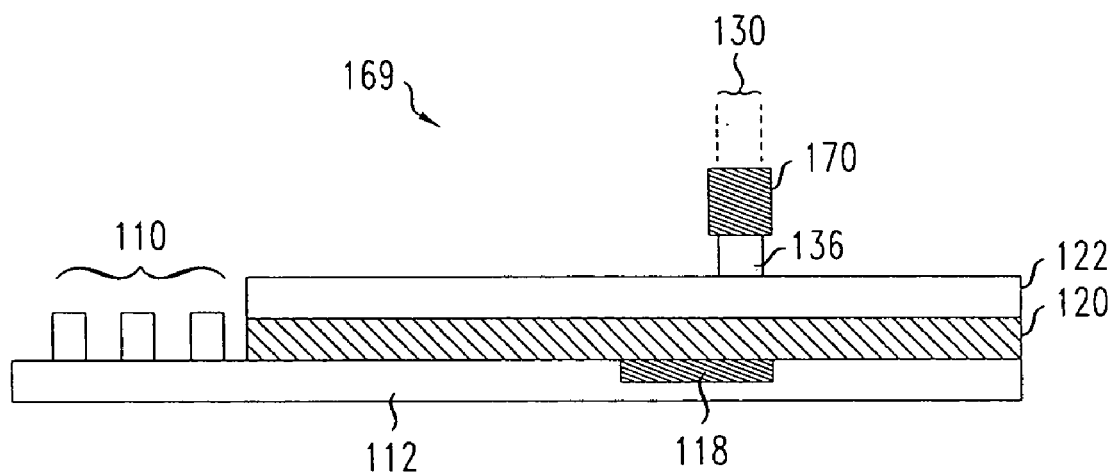
Figure 21:
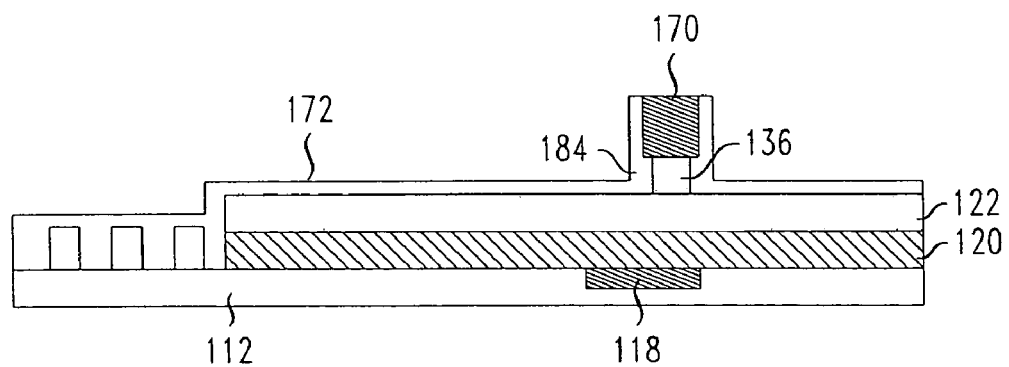

Referring to FIG. 21, the alternate method includes depositing a protective $Si_3N_4$ layer over the structure 169 of FIG. 20. The same process that formed the $Si_3N_4$ layer 114 of FIG. 7 forms the new protective $Si_3N_4$ layer. The new protective $Si_3N_4$ layer includes a 50 nm thick horizontal portion 172 that protects the base layer 122. The protective $Si_3N_4$ layer also includes 50 nm thick vertical sidewalls 184 that protect the final emitter 136.

Figure 22:
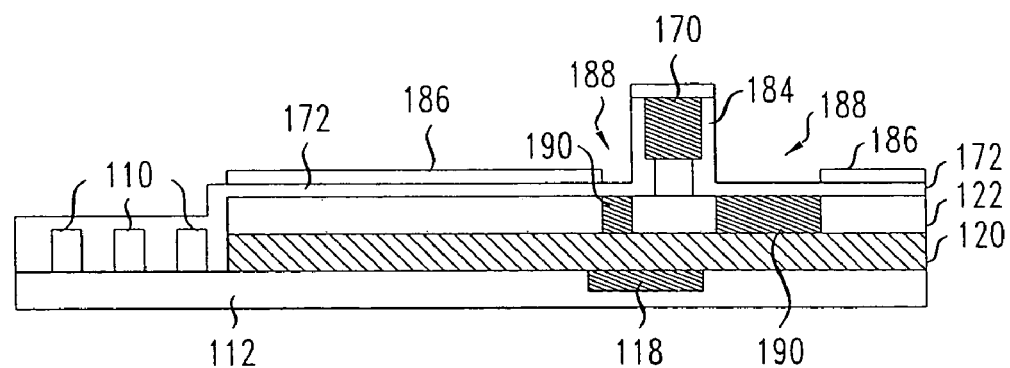

Referring to FIG. 22, the alternate method includes forming a Au—Ti implant mask 186 on the horizontal portion 172 of the protective $Si_3N_4$ layer. The same process that formed the Ti—Au mask 116 of FIG. 8 forms the Au—Ti implant mask 186. The Au—Ti mask 186 includes a window 188 over a part of the DHBT's extrinsic region.

The alternate method includes forming a heavily doped base extension 190 with a lower sheet and contact resistance than the original base layer 122. The heavily doped base extension 190 is formed by co-implantation of phosphorous (P) and a P-type dopant, such as magnesium (Mg), zinc (Zn), or beryllium (Be).

The co-implantation is a two-step process. The first step, the process implants a dose of about $2 \times 10^{14}/cm^2$ of 25 keV Mg ions. In the second step, the process implants an equal dose of 40 keV P ions. In each step, the impacting ions have 7° tilt with respect to the normal to the surface of the base layer 122. The tilt lowers the probability that ions will channel through the crystal. The tilt does not cause ion implantation in the emitter 136, because the thin silicon nitride sidewall 184 stops ions that impact at low angles. After the implantation, the Au—Ti implant mask 186 is removed by the same process used to remove the Au—Ti mask layer 116 of FIG. 8.

Figure 23:
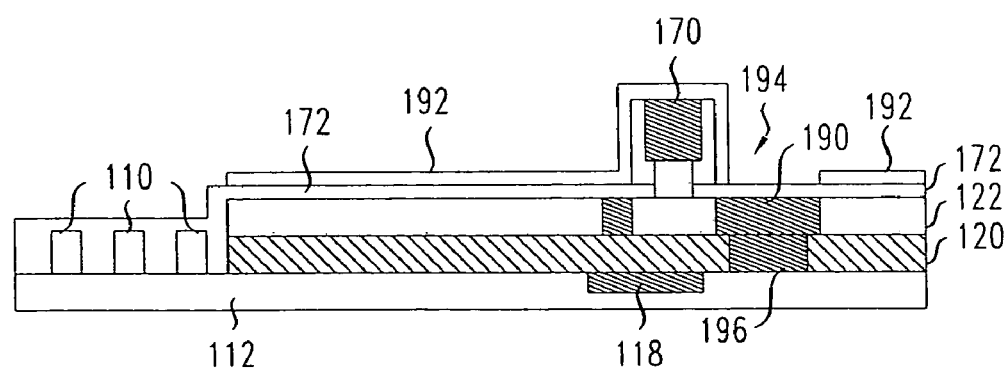
Figure 24:
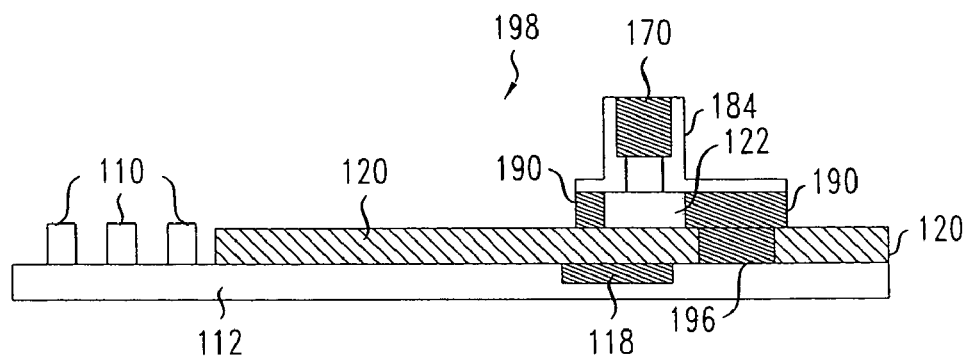

Referring to FIG. 23, the alternate method includes performing a deep implant of P-type dopants into a portion 196 of the original N-type InP collector layer 120. To perform the deep implant, a new Au—Ti implant mask 192 is formed on the protective $Si_3N_4$ layer 172. The new Au—Ti implant mask 192 includes a window 194 that exposes a limited portion of the earlier window 188. Through the window 194, an ion implant process implants equal doses of 60 keV Mg ions and 85 keV P ions. The dose of Mg is sufficient to convert the portion 196 of the originally N-type collector layer 120 into a heavily P-type doped layer. After the deep implant, an etch removes the Au—Ti implant mask 192, and a 5 to 15 second anneal at 750° C. to 850° C. activates the implanted Mg and P atoms.

After the deep implant, a mask-controlled etch removes a lateral portion of the protective $Si_3N_4$ layer 172 to expose the underlying base layer 122. Then, a second mask-controlled wet etch removes exposed portions of the base layer 122 to produce the structure 198 of FIG. 24.

Figure 25:
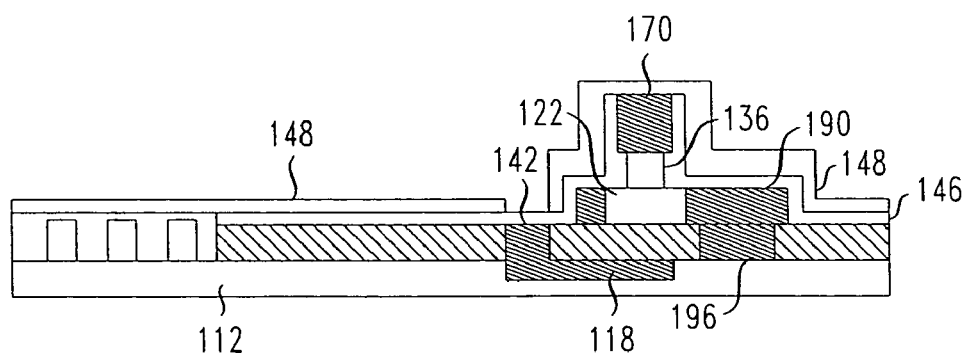

Referring to FIG. 25, the alternate method includes forming another Au—Ti implant mask and performing the same implant and anneal process described with respect to FIG. 14 to produce highly doped channel 142. The highly doped channel 142 forms a conducting electrical connection to the conducting subcollector region 118.

Figure 26:
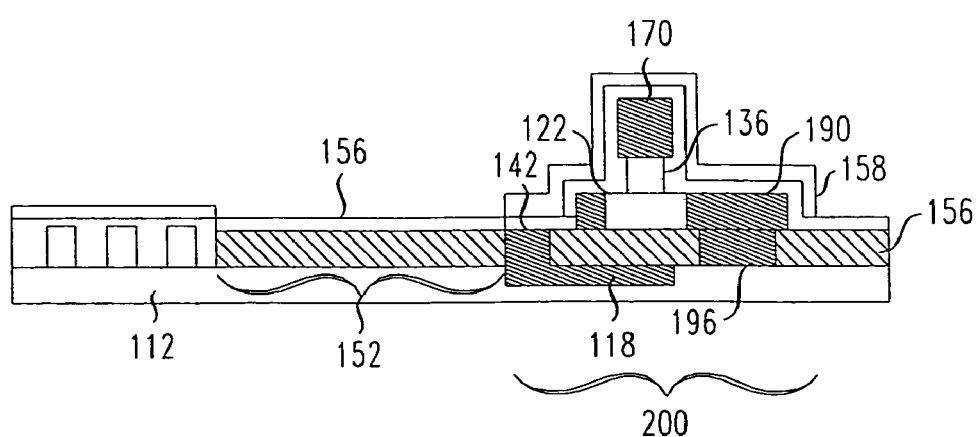

Referring to FIG. 26, the alternate method includes performing the same multi-step damage treatment already described with respect to FIG. 15. The multi-step damage treatment lowers the conductivity of the portion 152 of the original collector layer 120. The treatment causes the portion 152, which surrounds the DHBT's footprint region, to be non-conductive thereby electrically isolating the vertical DHBT structure 200 from other devices (not shown) on the substrate 112.

Figure 27:
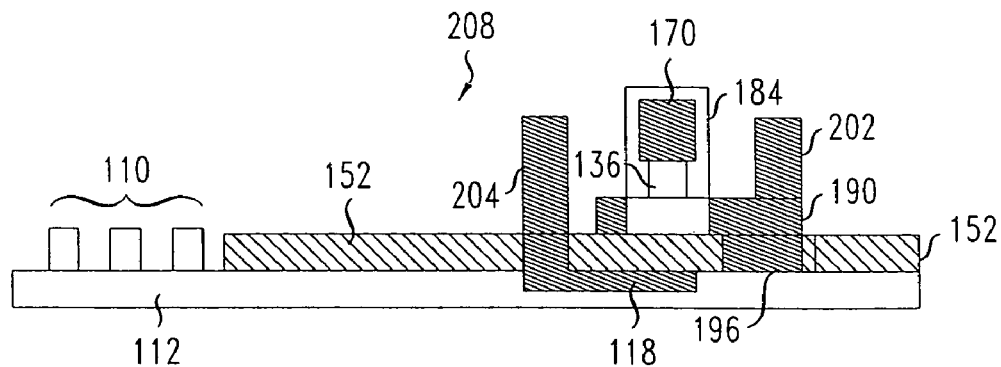

Referring to FIG. 27, the alternate method includes forming a non-aligned base and collector electrodes 202, 204. To form the electrodes, an evaporation deposits Pd, Pt, and Au on the base extension 190 and on the exposed end of the conductive channel 142. Then, an anneal at about 300° C. completes the production of the electrodes 202, 204.

Figure 28:
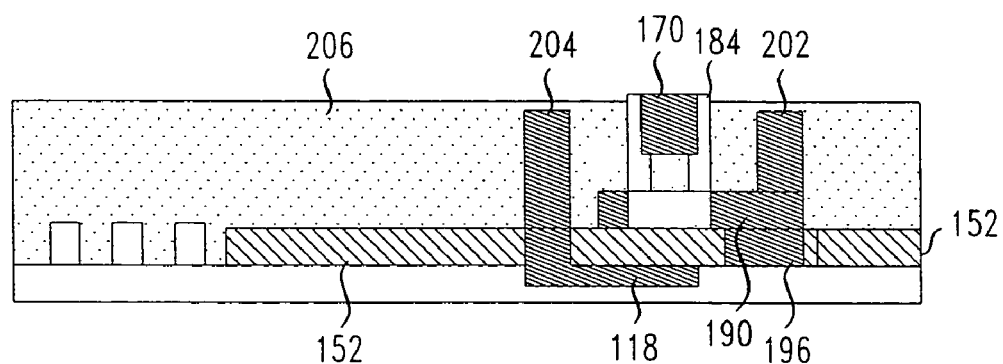

Referring to FIG. 28, the alternate method includes spinning a protective layer of BCB onto the structure 208 of FIG. 27. Then, a conventional etch-back of the BCB is used to expose the dummy emitter 170.

Figure 29:
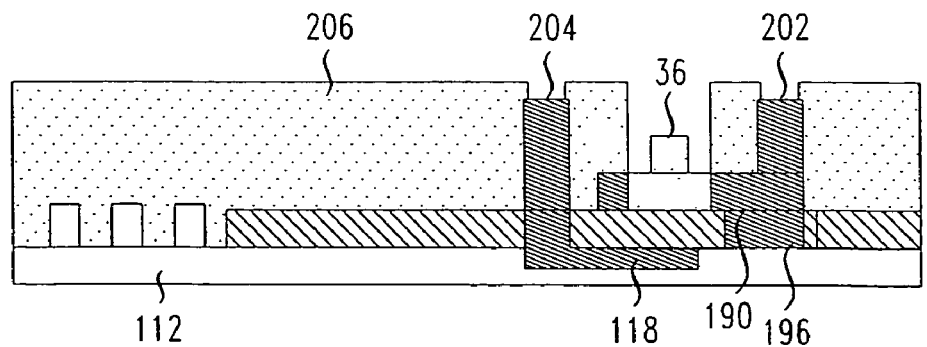

Referring to FIG. 29, the alternate method includes performing conventional etches to produce vias that expose the base and collector electrodes 202, 204 and to remove the dummy emitter 170. Then, a conventional metallization process produces electrical connections to the emitter 36 and to the base and collector electrodes 20, 204.

While some of illustrative embodiments show emitter-on-top/collector-on-bottom vertical structures for bipolar transistors, the invention is intended to also cover embodiments of collector-on-top/emitter-on-bottom vertical structures for bipolar transistors. One of skill in the art could easily make such collector-on-top/emitter-on-bottom vertical structures from the teachings in this specification.

Other embodiments will be apparent to those skilled in the art from consideration of the above-described embodiments, the drawings, and the claims.

What we claim is:

1. A method, comprising:
   ion implanting a dopant into a semiconductor substrate to form a conductive area therein;
   forming a sequence of semiconductor layers on the substrate, the sequence including a collector layer, a base layer in contact with the collector layer, and an emitter layer in contact with the base layer, one of the semiconductor layers having a bottom surface in contact with the conductive area;
   etching away a portion of two of the semiconductor layers to expose a portion of the one of the semiconductor layers; and
   ion implanting a dopant into a portion of the exposed portion of the one of the semiconductor layers to form a conductive channel between the conductive area and a top surface of the exposed portion of the one of the semiconductor layers.

2. The method of claim 1, further comprising treating another portion of the one of the semiconductor layers to make the another portion nonconductive, the another portion laterally surrounding a device footprint region that includes the implanted portion of the one of the semiconductor layers.

3. The method of claim 1, wherein the one of the semiconductor layers is the collector layer and the conductive area is a conducting subcollector connection.

4. The method of claim 1, further comprising:
   etching the last formed one of the semiconductor layers to define intrinsic and extrinsic regions of a vertical structure for a bipolar transistor.

5. The method of claim 4, further comprising:
   ion implanting a dopant into a portion of the base layer to form an implant doped base extension.

6. The method of claim 5, wherein the ion implanting into a portion of the base layer produces in the base extension a concentration of dopant atoms that is at least two times as high as a concentration of dopant atoms in the portion of the base layer in the intrinsic region.

7. The method of claim 5, wherein the base extension is thicker than a portion of the base layer in the intrinsic region.

8. The method of claim 1, wherein the forming a sequence comprises performing a sequence of epitaxial growths of doped semiconductor layers.

9. The method of claim 5, further comprising:
   forming an electrode on a portion of the last formed one of the semiconductor layers; and
   forming an electrode on the base extension; and
   wherein the two electrodes are separated by a lateral gap.

10. The method of claim 1, wherein each formed layer comprises one of InP, InGaP, InGaAs, InGaAsP, GaAs, InAlGaAs, AlGaAs, GaSb, AlSb, GaAlSb, InSb, InAsSb, GaAsSb, InGaSb, GaN, InN, AlN, InGaN, AlGaN, and InGaAlN.

* * * * *